United States Patent [19]

Konrad et al.

[11] Patent Number: 5,526,216
[45] Date of Patent: Jun. 11, 1996

[54] CIRCUIT CONFIGURATION FOR GENTLE SHUTOFF OF AN MOS SEMICONDUCTOR COMPONENT IN THE EVENT OF EXCESS CURRENT

[75] Inventors: Sven Konrad, Blankenfelde; Klaus Reinmuth, München; Hans Stut, Gröbenzell, all of Germany

[73] Assignee: Siemens Aktiengesellschaft, Munich, Germany

[21] Appl. No.: 304,084

[22] Filed: Sep. 9, 1994

[30] Foreign Application Priority Data

Sep. 9, 1993 [DE] Germany ............ 43 30 624.1

[51] Int. Cl.⁶ ........................... H02H 9/02
[52] U.S. Cl. ................. 361/101; 361/57; 327/310
[58] Field of Search .................. 361/101, 54–57, 361/58, 98, 6–8, 13; 327/310

[56] References Cited

U.S. PATENT DOCUMENTS 3,969,637  7/1976  Minami et al. .............. 327/310

FOREIGN PATENT DOCUMENTS 0354435  2/1990  European Pat. Off. .
0467682  1/1992  European Pat. Off. .
3034927  9/1983  Germany .

OTHER PUBLICATIONS

IGBT-Technik vom Erfinder (IGBT Technique from an inventor) elektronikindustrie Jan. 1991, pp. 14, 16–18.

*Primary Examiner*—A. D. Pellinen
*Assistant Examiner*—Michael J. Sherry
*Attorney, Agent, or Firm*—Herbert L. Lerner; Laurence A. Greenberg

[57] ABSTRACT

In a circuit configuration for the shutoff of a semiconductor component in the event of excess current, the semiconductor component has gate and cathode terminals and is controlled by the field effect. A controllable switch is connected between the gate and cathode terminals and is made conducting by a control signal. A device controls the controllable switch to a range of high on-state DC resistance when there is excess current and a shutoff signal is simultaneously present.

6 Claims, 1 Drawing Sheet

CIRCUIT CONFIGURATION FOR GENTLE SHUTOFF OF AN MOS SEMICONDUCTOR COMPONENT IN THE EVENT OF EXCESS CURRENT

BACKGROUND OF THE INVENTION

Field of the Invention

The invention relates to a circuit configuration for shutoff of a semiconductor component controlled by field effect, in the event of excess current, including a controllable switch being located between the gate terminal and the cathode terminal and being made conducting by a control signal.

Such a circuit configuration is widely used and has been described for a MOSFET, for instance, in German Patent DE 30 34 927 C2. The controllable switch discharges the gate-to-source capacitance of the semiconductor component when it is made conducting and thus blocks the semiconductor component.

When there is excess current in the semiconductor component that is caused, for instance, by a short circuit of a load connected in series with the semiconductor component, the current rises far above the rated current. In order to protect the semiconductor component from destruction, the excess current is detected, and the semiconductor component is blocked by an internally generated shutoff signal. A property of field-effect-controlled semiconductor components, that is power MOSFETs and IGBTs (isolated gate bipolar transistors) is that their shutoff time is approximately the same, regardless of the current to be shut off. In other words, the steepness of the shutoff of current upon excess current is substantially greater than in the normal operating situation. As a result, the excess voltages generated upon shutoff at excess current in terms of stray inductance in the load current circuit are substantially higher than upon shutoff at rated load.

SUMMARY OF THE INVENTION

It is accordingly an object of the invention to provide a circuit configuration for the gentle shutoff of an MOS semiconductor component in the event of excess current, which overcomes the hereinafore-mentioned disadvantages of the heretofore-known devices of this general type and in which shutoff at excess current does not produce elevated excess voltage peaks.

With the foregoing and other objects in view there is provided, in accordance with the invention, in a circuit configuration for the shutoff of a semiconductor component in the event of excess current, the semiconductor component having gate and cathode terminals and being controlled by the field effect, the improvement comprising a controllable switch being connected between the gate and cathode terminals and being made conducting by a control signal; and a device for controlling the controllable switch to a range of high on-state DC resistance when there is excess current and a shutoff signal is simultaneously present.

In accordance with another feature of the invention, the switch is a transistor and the device adjusts a control voltage of the transistor for increasing the on-state DC resistance of the transistor, upon excess current with a simultaneously present shutoff signal.

In accordance with a further feature of the invention, there is provided a resistor having two terminals; a common terminal connected to one of the terminals of the resistor; the transistor having a control input and having a load current path being connected in series with the other of the terminals of the resistor and defining a node between the resistor and the transistor; first and second bipolar transistors having base terminals and having load paths connected in series between the control input of the transistor and the common terminal; the base terminal of the first bipolar transistor being connected to the node; and the second bipolar transistor being made conducting through its base terminal upon excess current.

In accordance with an added feature of the invention, there is provided another resistor connected in a current path of the field-effect-controlled semiconductor component, the base terminal of the second bipolar transistor being connected between the cathode terminal and the other resistor.

In accordance with a concomitant feature of the invention, the field-effect-controlled semiconductor component has a "sense" terminal, and the other resistor is connected to the "sense" terminal.

Other features which are considered as characteristic for the invention are set forth in the appended claims.

Although the invention is illustrated and described herein as embodied in a circuit configuration for the gentle shutoff of an MOS semiconductor component in the event of excess current, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
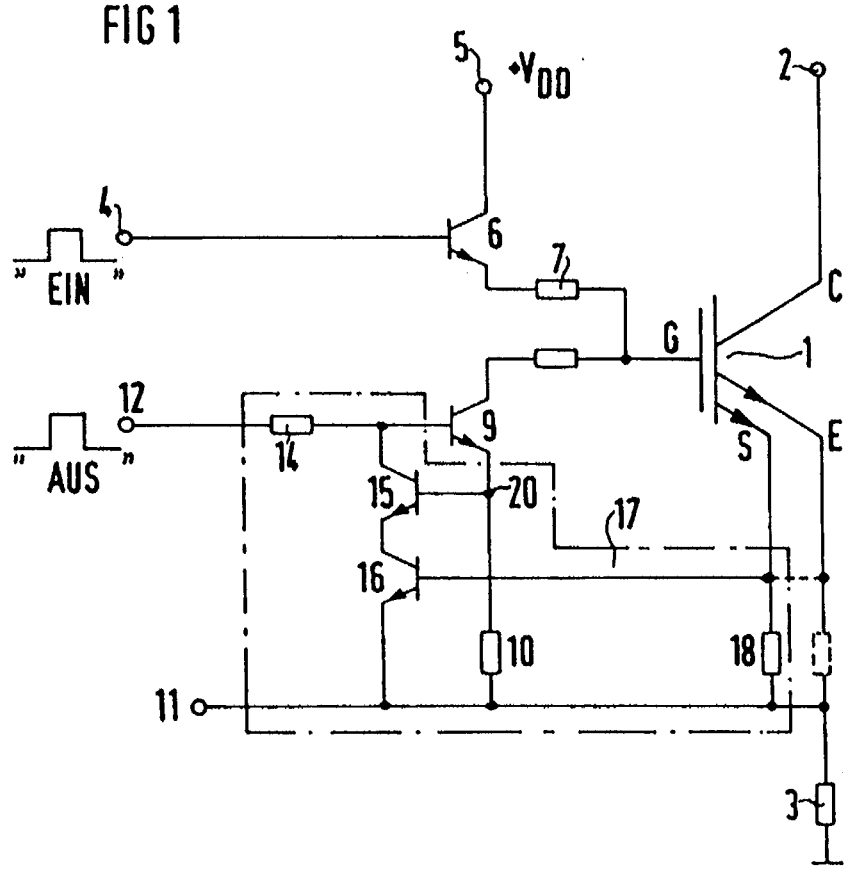
FIG. 1 is a schematic diagram of a circuit configuration according to the invention.

Referring now to the figures of the drawing in detail and first, particularly, to FIG. 1 thereof, there is seen a circuit configuration which includes an IGBT 1. This IGBT has a collector terminal C which is connected through a terminal 2 to an operating voltage. An emitter terminal E of the IGBT is connected through a load 3 to some other potential, such as ground. A gate terminal G of the IGBT 1 is connected through a resistor 7 and a collector-to-emitter path (load path) of a bipolar transistor 6 to a terminal 5, to which a supply voltage $+V_{DD}$ is applied. The bipolar transistor 6 has a base terminal that is connected to an input 4.

The gate terminal of the IGBT 1 is also connected through a further resistor and a collector-to-emitter path (load path) of a transistor 9 to a device 17. This device on one hand detects whether or not an excess current is present and on the other hand includes an input which is connected through a resistor 14 to an input 12.

In order to turn on the IGBT, an input signal "ON" is applied to the input 4. This makes the bipolar transistor 6 conducting, and the gate-to-source capacitance of the IGBT 1 is charged. It is therefore conducting as well.

If the IGBT is to be shut off from the normal operating state in which rated current flows, then an external "OFF" signal is applied to the input 12. This makes the transistor 9 conducting, and the gate-to-emitter capacitance of the IGBT is discharged, in accordance with the on-state or forward DC resistance of the transistor 9 and the resistors located in the discharge current path.

However, if upon excess current the IGBT 1 is shut off by an external "OFF" signal at the input 12, then the device 17 assures that the transistor 9 is not made fully conducting, but rather that its operating point is shifted to a range of high on-state or forward DC resistance.

The device 17 includes a first bipolar transistor 15 and a second bipolar transistor 16. Collector-to-emitter paths of the two transistors are connected in series.

A collector terminal of the first bipolar transistor 15 is connected to a base terminal of the transistor 9, and an emitter terminal of the second bipolar transistor 16 is connected to a common terminal 11. In addition, the base terminal of the transistor 9 is connected through the resistor 14 to the input 12, as mentioned above. The device 17 also includes a resistor 10 which is connected on one hand to the common terminal 11 and on the other hand to an emitter terminal of the transistor 9. A node 20 between the transistor 9 and the resistor 10 is connected to a base terminal of the first bipolar transistor 15, while a base terminal of the second bipolar transistor 16 is connected alternatively to either the emitter terminal E of the IGBT 1 or to a so-called "sense" terminal S. Power MOSFETs with such a terminal are described, for instance, in the journal "Machine Design", Mar. 8, 1990, pp. 89–96, while IGBTs are described, for instance, in the publication "Elektronik Industrie" No. 1, 1991, pp. 14–18. In the event that the base terminal of the transistor 16 is connected to the terminal S, then a measuring resistor 18 is connected between the terminal S and the common terminal 11. In the aforementioned alternative, the measuring resistor is located directly in the path of the load current of the IGBT, that is between its emitter terminal E and the load 3. In that case, it is dimensioned smaller by a factor $I_S/I_E$, in accordance with the current ratio.

The measuring resistor 18 and the device 17 are dimensioned in such a way that the bipolar transistor 16 is made conducting upon excess current. If a shutoff signal is simultaneously present at the input 12, a current then flows through the transistor 9, the base-to-emitter path of the transistor 15, and the collector-to-emitter path of the transistor 16. A voltage which is then present at the node 20 and thus at the emitter of the transistor 9 is equivalent to the sum of the base-to-emitter voltage of the transistor 15 and the conducting voltage of the transistor 16, with an example then being 1 V. Since the transistors 15, 16 have both been made conducting, a voltage which is present at the base terminal of the transistor 9 is determined on one hand by the voltage divider ratio of the resistor 14 and on the other hand by the sum of the voltage drops of the transistors 15 and 16. This is adjusted in such a way that as noted, the transistor 9 is controlled to a range with higher resistance, as compared with the fully conducting state. Therefore, discharging of the gate-to-source capacitance of the IGBT 1 proceeds more slowly, and the current is drawn by the IGBT correspondingly more slowly. Preferably, the device is dimensioned in such a way that the bipolar transistor 9 operates in the substantially horizontal portion of its $I_C/U_{CE}$ characteristic curve. In this case, the current is essentially independent of the collector-to-emitter voltage (current source), so that the discharge current is voltage-independent.

Figure 2:
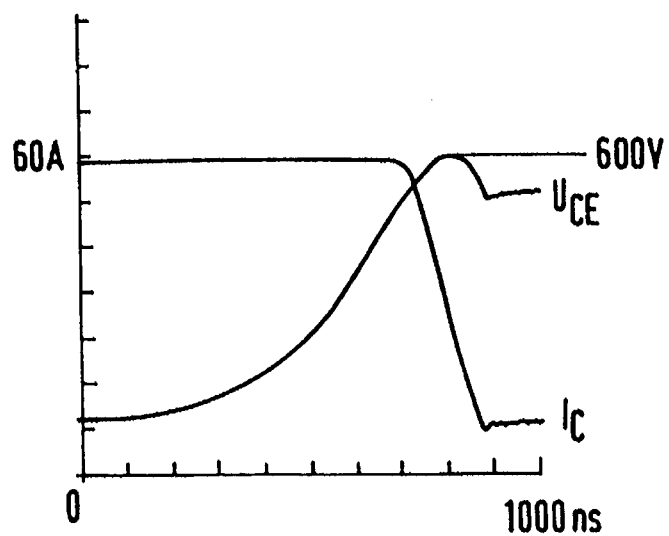
FIG. 2 is a diagram showing the course of current and voltage over time for the semiconductor component 1 of FIG. 1.

In FIG. 2, the courses of the voltage $U_{CE}$ and the current $I_C$ are plotted on the time axis. It can be seen from this that no harmful excess voltage occurs if the drop time of the current is 200 ns. When shutoff is performed from the normal state, the current drawn over the time –di/dt is less than in the case of shutoff performed from the excess current state. In that case, the IGBT can thus be shut off faster, without the occurrence of harmful excess voltages.

The invention has been described in conjunction with an IGBT. However, it may also be used for a power MOSFET. It is also possible in principle to replace the bipolar transistors 9, 15 and 16 with MOSFETs. In that case, the sum of the gate-to-source voltage of the transistor 15 and the on-state or forward DC voltage of the transistor 16 is present at the node 20.

By suitable dimensioning, it can be achieved that the transistor 9 likewise acts as a current source.

We claim:

1. In a circuit configuration for the shutoff of a semiconductor component in the event of excess current, the semiconductor component having gate and cathode terminals and being controlled by the field effect, the improvement comprising:

a first input connected to the gate terminal of the semiconductor component for charging a gate-to-source capacitance thereof;

a controllable switch for discharging the gate-to-source capacitance of the semiconductor component, and a second input connected to said controllable switch, said controllable switch being made conducting by a shutoff signal applied to said second input; and a device for controlling said controllable switch to a range of high on-state DC resistance when there is excess current and the shutoff signal is simultaneously present.

2. The circuit configuration according to claim 1, wherein said switch is a transistor and said device adjusts a control voltage of said transistor for increasing the on-state DC resistance of said transistor, upon excess current with a simultaneously present shutoff signal.

3. The circuit configuration according to claim 2, including:

a resistor having two terminals;

a common terminal connected to one of the terminals of said resistor;

said transistor having a control input and having a load current path being connected in series with the other of the terminals of said resistor and defining a node between said resistor and said transistor;

first and second bipolar transistors having base terminals and having load paths connected in series between the control input of said transistor and said common terminal;

the base terminal of said first bipolar transistor being connected to the node; and said second bipolar transistor being made conducting through its base terminal upon excess current.

4. The circuit configuration according to claim 3, including another resistor connected in a current path of the field-effect-controlled semiconductor component, the base terminal of said second bipolar transistor being connected between the cathode terminal and said other resistor.

5. The circuit configuration according to claim 4, wherein the field-effect-controlled semiconductor component has a "sense" terminal, and said other resistor is connected to the "sense" terminal.

6. In a circuit configuration for the shutoff of a semiconductor component in the event of excess current, the semiconductor component having gate and cathode terminals and being controlled by the field effect, the improvement comprising:

- a controllable switch connected to the gate terminal of the semiconductor component, said switch being a transistor made conducting by a control signal;
- a device for adjusting a control voltage of said transistor for increasing an on-state DC resistance thereof when excess current and a shutoff signal are simultaneously present;
- a resistor having two terminals;
- a common terminal connected to one of the terminals of said resistor;
- said transistor having a control input and having a load current path connected in series with the other of the terminals of said resistor and defining a node between said resistor and said transistor;
- first and second bipolar transistors having base terminals and having load paths connected in series between the control input of said transistor and said common terminal;
- the base terminal of said first bipolar transistor being connected to the node; and
- said second bipolar transistor being made conducting through its base terminal upon excess current.

* * * * *